(12) United States Patent
Gunji et al.

(10) Patent No.: US 7,994,535 B2
(45) Date of Patent: Aug. 9, 2011

(54) SEMICONDUCTOR DEVICE INCLUDING A JFET HAVING A SHORT-CIRCUIT PREVENTING LAYER

(75) Inventors: Hiroyuki Gunji, Tochigi-ken (JP); Tetsushi Otaki, Tochigi-ken (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 10/855,346

(22) Filed: May 28, 2004

(65) Prior Publication Data

US 2004/0238840 A1 Dec. 2, 2004

(30) Foreign Application Priority Data

May 30, 2003 (JP) .............................. P. 2003-154865

(51) Int. Cl.
*H01L 29/74* (2006.01)
(52) U.S. Cl. ..................... 257/134; 257/256; 257/272
(58) Field of Classification Search .................. 257/134, 257/256, 268, 272; 438/188
See application file for complete search history.

(56) References Cited

U.S. PATENT DOCUMENTS

| | | | | |
|---|---|---|---|---|
| 3,656,031 A | * | 4/1972 | Bresee et al. | 257/285 |
| 3,681,668 A | * | 8/1972 | Kobayashi | 257/272 |
| 4,176,368 A | * | 11/1979 | Compton | 257/285 |
| 4,322,738 A | * | 3/1982 | Bell et al. | 257/273 |
| 4,485,392 A | * | 11/1984 | Singer | 257/272 |
| 4,700,461 A | * | 10/1987 | Choi et al. | 438/149 |
| 4,795,716 A | * | 1/1989 | Yilmaz et al. | 438/209 |
| 5,929,503 A | * | 7/1999 | Beasom | 257/497 |
| 6,740,907 B2 | * | 5/2004 | Sakamoto | 257/134 |
| 6,861,303 B2 | * | 3/2005 | Hao et al. | 438/189 |
| 6,900,506 B1 | * | 5/2005 | Yu et al. | 257/409 |

FOREIGN PATENT DOCUMENTS

| | | |
|---|---|---|
| JP | 11162993 | 6/1999 |
| JP | 2002-190480 | 7/2002 |
| JP | 2002-313813 | 10/2002 |
| WO | WO 02/103807 * | 12/2002 ............. 257/256 |

OTHER PUBLICATIONS

Japanese Office Action, with English translation, issued in Japanese Patent Application No. 2003-154865, mailed Jul. 14, 2009.

* cited by examiner

*Primary Examiner* — Ori Nadav
(74) *Attorney, Agent, or Firm* — McDermott Will & Emery LLP

(57) ABSTRACT

To improve the surge resistance of J-FET, a P-type epitaxial layer 2 and an N-type epitaxial layer 3 are formed on a $P^{++}$-conductive substrate 1; $N^+$-conductive source diffusion layer 4 and drain diffusion layer 5, and a $p^+$-conductive gate diffusion layer 6 are formed in the N-type epitaxial layer 3; and a short-circuit preventing layer 8 of a reversed conduction-type diffusion layer is formed adjacent to the side walls of the source diffusion layer 4 and the drain diffusion layer 5. Having the constitution, the punch-through to be caused by surge voltage is prevented in the surface region of the device, and the surge resistance thereof is improved. Via the holes formed in a protective insulation film 9 on the surface of the device, a source electrode 10 connected to the source diffusion layer 4, and a drain electrode 11 connected to the drain diffusion layer 5 are formed on the surface side of the device. A gate electrode 12 is formed on the back of the substrate 1, and this is connected to the gate diffusion layer 6 via a contact diffusion layer 7 formed in the device.

17 Claims, 10 Drawing Sheets

SEMICONDUCTOR DEVICE INCLUDING A JFET HAVING A SHORT-CIRCUIT PREVENTING LAYER

BACKGROUND OF THE INVENTION

1. Field of the Invention

The present invention relates to a semiconductor device and a method for producing it, and in particular to the improvement in the surge resistance of a semiconductor device having a junction field-effect transistor (hereinafter abbreviated to J-FET).

2. Description of the Related Art

A conventional J-FET has a basic structure that comprises a P-type epitaxial layer 2 formed on a $P^{++}$-conductive substrate 1; an N-type epitaxial layer 3 on the P-type epitaxial layer 2; and an $N^+$-conductive source diffusion layer 4, an $N^+$-conductive drain diffusion layer 5 and a $P^+$-conductive gate diffusion layer 6 formed in the N-type epitaxial layer 3, as in FIG. 15. A $P^+$-conductive contact diffusion layer 7 is formed, and this is connected to the gate diffusion layer 6 at a site not shown in the drawing A source electrode 10 and a drain electrode 11 are formed, and they are connected to the source diffusion layer 4 and the drain diffusion layer 5, respectively, via the holes formed in the protective insulation film 9. A gate electrode 12 is formed entirely on the back of the substrate so that this is connected to the contact diffusion layer 7 via the substrate 1 (for example, refer to JP-A 11-162993).

In the ordinary unit J-FET having the above-mentioned basic structure, the impurity concentration in the $P^{++}$-conductive substrate 1 is on the order of $10^{20}$ cm$^{-3}$; the impurity concentration and the thickness of the P-type epitaxial layer 2 are from $10^{15}$ cm$^{-3}$ to $10^{16}$ cm$^{-3}$, and from 10 μm to 20 μm, respectively; the impurity concentration and the thickness of the contact diffusion layer 7 are from $10^{18}$ cm$^{-3}$ to $10^{20}$ cm$^{-3}$, and from 10 μm to 30 μm, respectively; and the impurity concentration and the thickness of the N-type epitaxial layer 3 are from $10^{15}$ cm$^{-3}$ to $10^{16}$ cm$^{-3}$, and from 2 μm to 20 μm, respectively. The impurity concentration and the thickness of the source diffusion layer 4 and the drain diffusion layer 5 are from $10^{18}$ cm$^{-3}$ to $10^{20}$ cm$^{-3}$, and from 1 μm to 3 μm, respectively; the impurity concentration and the thickness of the gate diffusion layer 6 are from $10^{18}$ cm$^{-3}$ to $10^{20}$ cm$^{-3}$, and from 1 μm to 5 μm, respectively. Under such condition, various unit J-FETs are produced in accordance with the application of the devices comprising them.

However, the above-mentioned conventional J-FET structure has a problem in that it is electrically ruptured with some frequency owing to the high-voltage noise (hereinafter referred to as "surge voltage") running into the source electrode 10, the drain diffusion layer 5 or the gate electrode 12 (gate diffusion layer 6) thereof from the peripheral devices around it (this will be hereinafter referred to as "surge rupture"). The surge rupture is described with reference to FIG. 16. FIG. 16 is a graphical view of the above-mentioned unit J-FET. As illustrated, the $P^+$-conductive gate diffusion layer and contact diffusion layer and the $P^{++}$-conductive substrate that are in a P-conductive region are connected to the gate electrode; while the $N^+$-conductive source diffusion layer and drain diffusion layer that are in an N-conductive region are connected to the source electrode and the drain electrode, respectively. J-FET of the type is driven under the electric interconnection as illustrated, and when the above-mentioned surge voltage is instantaneously applied between the source diffusion layer or the drain diffusion layer and the gate diffusion layer, then a heavy current may run through the PN junction of the above-mentioned structure, and the structure especially between the source diffusion layer and the gate diffusion layer may be thereby ruptured. The surge rupture of the type occurs more frequently when the spacing distance between the source diffusion layer or the drain diffusion layer and the gate diffusion layer is narrower. Accordingly, it is difficult to reduce the spacing distance between the source diffusion layer or the drain diffusion layer and the gate diffusion layer, and this will be a bar to further increasing the density of J-FET. The problem with high-density unit J-FET applies also to J-FET-mounted integrated circuits.

SUMMARY OF THE INVENTION

The present invention has been made in consideration of the situation as above, and its object is to provide a J-FET-having semiconductor device in which the resistance to surge rupture (hereinafter referred to as "surge resistance") of the J-FET is improved and the density there of can be increased, and to provide a method for producing it.

The semiconductor device of the invention has a junction field-effect transistor that comprises, formed in the surface of a channel region of a first conduction-type semiconductor region, source/drain diffusion regions of a high-concentration diffusion region of the first conduction type, and a gate diffusion region of a second conduction type that differs from the first conduction type, formed between the source/drain diffusion regions, in which a short-circuit preventing layer is formed in the surface between the gate diffusion region and the source/drain diffusion regions.

In general, when a surge voltage to be a reverse bias is applied between source/drain diffusion regions and a gate diffusion region of J-FET, then the depletion layer may readily extend in the surface between the source/drain diffusion regions and the gate diffusion region, and the PN junction is thereby ruptured owing to the heavy current that starts from the avalanche breakdown accompanied by the punch-through phenomenon caused by the depletion layer. In the semiconductor device of the invention, a short-circuit preventing layer is formed in the surface region of J-FET, and it acts to prevent the depletion layer from extending in the surface region and to retard the avalanche breakdown, thereby improving the surge resistance of J-FET.

Preferably, the short-circuit preventing layer is formed in the surface of the substrate adjacent to the source/drain diffusion regions. Also preferably, the short-circuit preventing layer is formed around the source/drain diffusion regions. Also preferably, the short-circuit preventing layer is so formed that its depth is shorter than that of the source/drain diffusion regions.

Having the constitution as above, the advantage of the semiconductor device is that the short-circuit preventing layer does not run deeply into the current route on the source side, and has few influences on the current capability of J-FET. In addition, the semiconductor device well keeps the triode region characteristics that are the electric characteristics of J-FET.

Preferably, the short-circuit preventing layer is a diffusion layer of the second conduction type, or it is a diffusion layer of the first conduction type that has a higher concentration than the semiconductor region and has a lower concentration than the source/drain diffusion layers.

Also preferably, the short-circuit preventing layer is formed in the surface of the substrate adjacent to the gate diffusion region. Also preferably, the short-circuit preventing layer is formed around the gate diffusion region. Also preferably, the short-circuit preventing layer is so formed that its depth is shorter than that of the gate diffusion region.

Having the constitution as above, the advantage of the semiconductor device is that the short-circuit preventing layer does not run deeply into the channel region to the bottom of the gate, and has few influences on the gate control of J-FET. In addition, the semiconductor device well keeps the mutual conductance characteristics that are the electric characteristics of J-FET.

Preferably, the short-circuit preventing layer is a diffusion layer of the first conduction type, or it is a diffusion layer of the second conduction type that has a lower concentration than the gate diffusion region.

The semiconductor device of the invention may be so designed that the semiconductor region is formed on a high-concentration substrate of a second conduction type and a part of the gate diffusion layer is electrically connected thereto via contact diffusion formed from the surface side of the substrate so that it may reach the second conduction-type, high-concentration substrate.

Having the constitution, the gate electrode may be formed on the back side of the substrate of J-FET, and this facilitates external connection of the semiconductor device.

The semiconductor device of the invention may be so designed that the source/drain diffusion regions are aligned opposite to each other like comb teeth, and source/drain electrodes are formed above the source/drain diffusion regions.

Having the constitution, the source/drain diffusion regions and the gate diffusion regions may be aligned like comb teeth at high density to provide high-speed and energy-saving J-FET units that have enhanced operation capabilities.

The method for producing the semiconductor device of the invention comprises a step of introducing a first ion impurity into predetermined regions of the surface of a semiconductor region of a first conduction type to thereby form source/drain diffusion regions that comprise the first conduction-type high-concentration diffusion region, a step of introducing a second ion impurity between the source/drain diffusion regions to thereby form a gate diffusion region of a second conduction type that differs from the first conduction type, a step of introducing a third ion impurity into the surface between the gate diffusion region and the source/drain diffusion regions to thereby form a short-circuit preventing layer, and the method is characterized in that it forms J-FET having a short-circuit preventing layer.

Preferably, the third ion impurity is of the same conduction type as that of the second ion impurity, and the step of forming the short-circuit preventing layer is after the step of forming the gate diffusion region and the step of forming the source/drain diffusion regions.

According to the production method as above, the short-circuit preventing layer may be formed in the region adjacent to the end of the source/drain diffusion regions or the gate diffusion region, or in a predetermined region between the gate diffusion region and the source/drain diffusion regions, with accuracy. In addition, the depth of the short-circuit preventing layer thus formed with accuracy in the manner as above may be shorter than that of the source/drain diffusion regions or the gate diffusion region.

DESCRIPTION OF THE PREFERRED EMBODIMENTS

Embodiments of the semiconductor device of the invention and those of the method for producing it are described below with reference to the drawings attached hereto.

First Embodiment of the Invention

Figure 1:
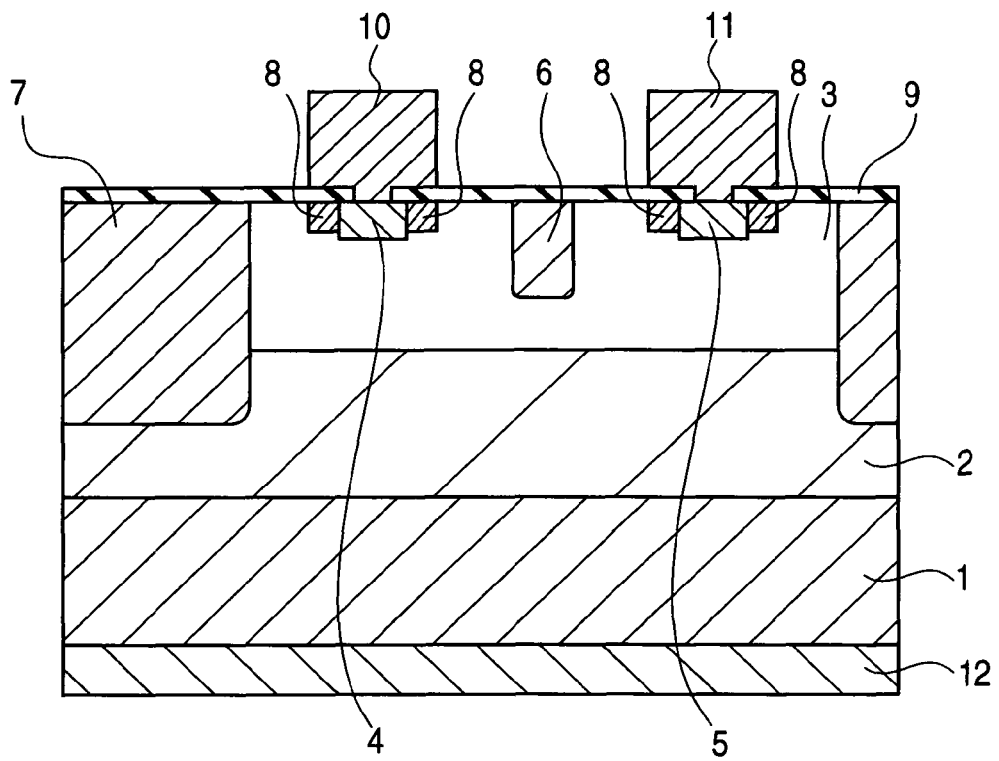
FIG. 1 is a cross-sectional view of a unit J-FET for explaining the first embodiment of the invention.

FIG. 1 is a cross-sectional view showing the basic structure of J-FET of the first embodiment of the invention. In the drawing, the same parts as those described in the section of the related art are designated by the same reference numerals as therein. This embodiment is characterized in that a short-circuit preventing layer 8 that comprises a diffusion layer of a reverse conduction type is formed around a source diffusion layer 4 and a drain diffusion layer 5 to be in contact with the side walls thereof. In FIG. 1, a P-type epitaxial layer 2 having an impurity concentration of $1 \times 10^{15}$ cm$^{-3}$ and a thickness of 10 μm is formed on a P$^{++}$-conductive substrate 1 having an impurity concentration of $10^{20}$ cm$^{-3}$ or so; and an N-type epitaxial layer 3 having an impurity concentration of $5 \times 10^{15}$ cm$^{-3}$ and a thickness of 5 μm is formed thereon. The P-type epitaxial layer 2 is formed for relaxing the auto-doping from the P$^{++}$-conductive substrate 1.

In the N-type epitaxial layer 3, formed are N$^+$-conductive source diffusion layer 4 and drain diffusion layer 5 each having a depth of 1 μm or so, and a P$^+$-conductive gate diffusion layer 6 having a depth of 3 μm or so. In the invention, the short-circuit preventing layer 8 that comprises a diffusion layer of a reverse conduction type is formed in contact with the side wall of the source diffusion layer 4 and the drain diffusion layer 5. The depth of the short-circuit preventing layer 8 is from 0.5 μm to 0.8 μm, and is shorter than that of the source diffusion layer 4 and the drain diffusion layer 5. When the spacing distance between the side wall of the source diffusion layer (or the drain diffusion layer 5) and that of the gate diffusion layer 6 is 10 μm or so, then the width of the short-circuit preventing layer 8 is 3 μm or so, or that is, about ⅓ of the spacing distance mentioned above. The Impurity concentration in the source diffusion layer 4 and the drain diffusion layer 5 is from $10^{18}$ cm$^{-3}$ to $10^{20}$ cm$^{-3}$; and the impurity concentration in the short-circuit preventing layer is from $10^{16}$ cm$^{-3}$ to $10^{18}$ cm$^{-3}$. The impurity concentration in the gate diffusion layer 6 is from $10^{18}$ cm$^{-3}$ to $10^{20}$ cm$^{-3}$.

Figure 15:
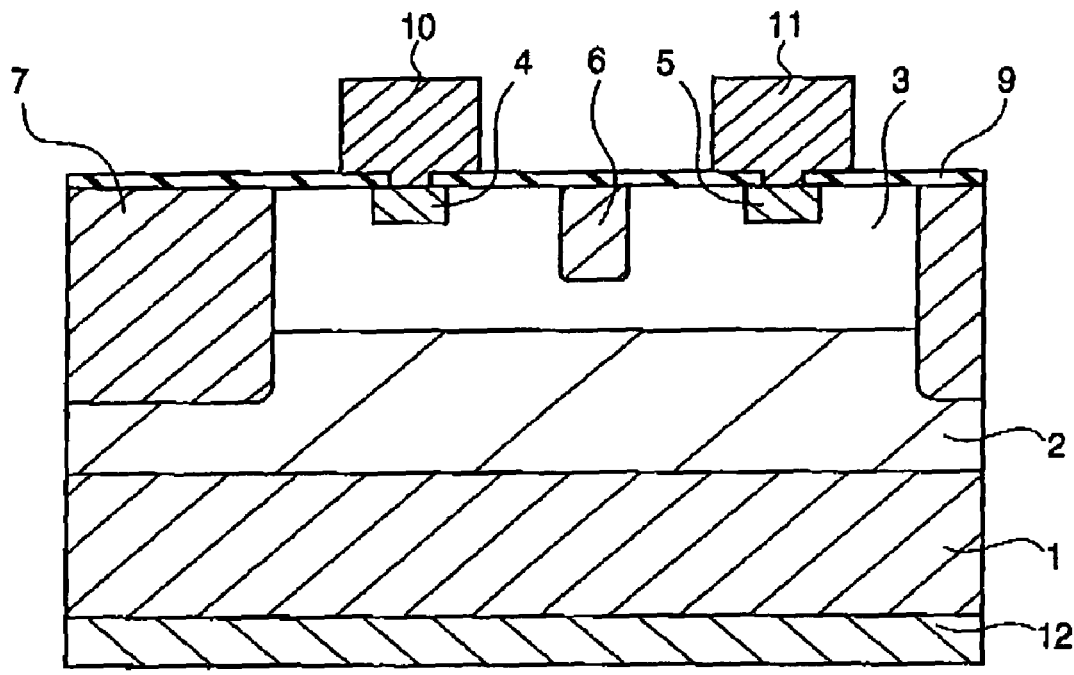
FIG. 15 is a cross-sectional view of a unit J-FET for explaining a related art.
Figure 16:
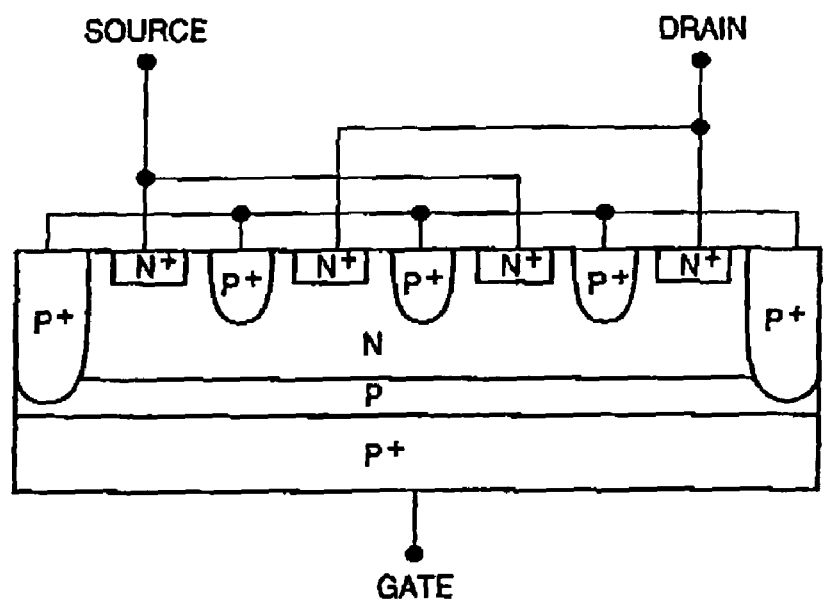
FIG. 16 is a schematic cross-sectional view of the unit J-FET for explaining the surge rupture in the related art.

The other constitution of the embodiment of FIG. 1 is the same as that of FIG. 15. Briefly, a P$^+$-conductive contact diffusion layer 7 having a depth of 7 μm or so that is connected to the gate diffusion layer 6 is formed; a source electrode 10 and a drain electrode 11 are formed so as to be connected to the source diffusion layer 4 and the drain diffusion layer 5, respectively, via the holes formed in the protective insulation film 9; and a gate electrode 12 is formed on the back of the substrate. The gate electrode is connected to the gate diffusion layer 6 in the surface of the structure, via the P$^{++}$-conductive substrate 1 and the contact diffusion layer 7 that are to be substrate contacts. The short-circuit preventing layer 8 is not connected to the source electrode 10 or the drain electrode 11, and is kept floating.

In this embodiment, the short-circuit preventing layer is formed in contact with both side walls of the source diffusion layer 4 and with both side walls of the drain diffusion layer 5, but it may be formed around only the side walls of the source diffusion layer 4 or the side walls of the drain diffusion layer 5. Alternatively the short-circuit preventing layer 8 may be formed only on one side of the source diffusion layer 4 that faces the gate diffusion layer 6, or only on one side of the drain diffusion layer 5 that faces the gate diffusion layer 6. In this embodiment, the impurity concentration in the short-circuit preventing layer 8 may be on the same level as that of the source diffusion layer 4 or the drain diffusion layer 5; or the impurity concentration in the short-circuit preventing layer 8 may be lowered to be on the same level as that of the N-type epitaxial layer 3.

In the J-FET structure of the first embodiment of the invention, the short-circuit preventing layer 8 is formed adjacent to the side wall of the source diffusion layer 4 or to the side wall of the drain diffusion layer 5, and the surge resistance of J-FET is thereby increased to 2 to 3 times that of the conventional one. With the increase in the surge resistance thereof, the spacing distance between the source diffusion layer or the drain diffusion layer and the gate diffusion layer in J-FET may be more readily reduced and the density of J-FET is more readily increased. The effect of the short-circuit preventing layer 8 is more remarkable when the depth thereof is longer. If too deep, however, the layer 8 may have some influences on the operational characteristics of J-FET. Accordingly, when the depth of the short-circuit preventing layer 8 is made shorter than that of the source diffusion layer 4 or the drain diffusion layer 5, then it solves the problem with the layer 8 to interfere with the current pass through the device, and provides good J-FET.

Figure 2:
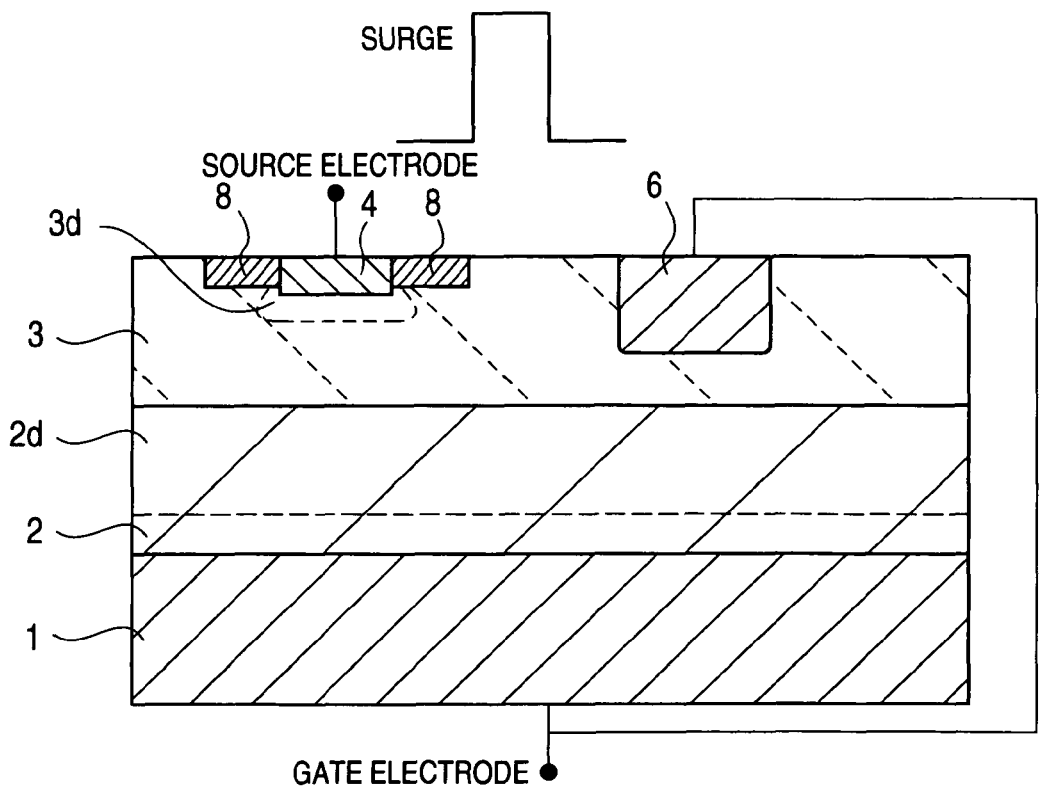
FIG. 2 is a schematic cross-sectional view for explaining the effect and the advantage of the first embodiment of the invention.

Next described are the effect and the principle of the short-circuit preventing layer of improving the surge resistance of J-FET according to the invention, with reference to the schematic view of FIG. 2. In this drawing, the same parts as in FIG. 1 are designated by the same reference numerals as therein. As in the drawing, when a surge voltage, a high voltage that is positive to the source electrode (or the drain electrode) relative to the gate electrode is applied to the device, then depletion layers 2d and 3d are formed in the P-type region of the PN-junction constituting gate diffusion layer 6, the P$^{++}$-conductive substrate 1 and the P-type epitaxial layer 2, and in the N-type region of the source diffusion layer and the N-type epitaxial layer, as in FIG. 2. The P-type epitaxial layer 2 below the N-type epitaxial layer 3 has the function of making it difficult for the depletion layer that is formed by the surge voltage to reach the high-concentration impurity region, the source diffusion layer 4. This is because the depletion layer 2d formed in the P-type epitaxial layer 2 relaxes the electric field of the surge voltage. In that manner, the PN junction forms a structure of N$^+$NPP$^{++}$ in the bottom direction of the source diffusion layer 4, as in FIG. 2, and the punch-through resistance thereof is thereby increased. As opposed to this, in the conventional J-FET structure shown in FIG. 15, the PN junction forms a structure of N$^+$NP$^+$ in the surface region in the side direction of the source diffusion layer 4, or that is, between the source diffusion layer 4 and the gate diffusion layer 6. This means that the conventional structure does not have a region for electric field relaxation like the above-mentioned P-type epitaxial layer 2, and punch-through readily occurs in its surface region. The present invention solves this problem. Concretely, the short-circuit preventing layer 8 is inserted between the gate diffusion layer 6 and the source diffusion layer 4 in the surface region where punch-through may readily occur. As shown by the dotted line in FIG. 2, the short-circuit preventing layer 8 acts to prevent the depletion layer from extending in the surface region and to retard punch-through therein, therefore protecting the PN junction of the device from being ruptured by the heavy current caused by punch-through. The surge resistance of the semiconductor device of the invention is improved in that manner.

In the first embodiment mentioned above, the short-circuit preventing layer 8 is a P-conductive layer. However, it may be an N-conductive layer that is opposite to the conduction type of the source/drain diffusion layers so far as the impurity concentration in the layer 8 is kept higher than that of the N-type epitaxial layer 3. This is because the layer 8 of the type may act to prevent the depletion layer from extending in the surface region and to retard punch-through therein, and the surge resistance of the device may increase for the same reason as above. The embodiment of the type will be described herein under.

Figure 3:
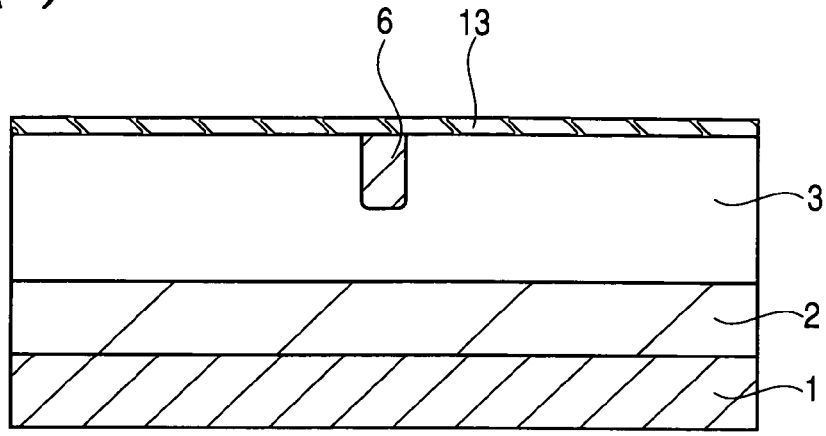
FIG. 3 shows cross-sectional views of a process of producing J-FET of the first embodiment of the invention.
Figure 3:
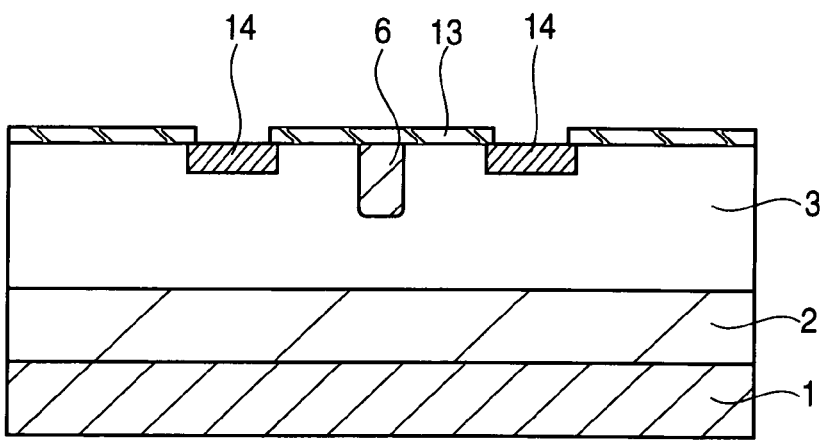
Figure 3:
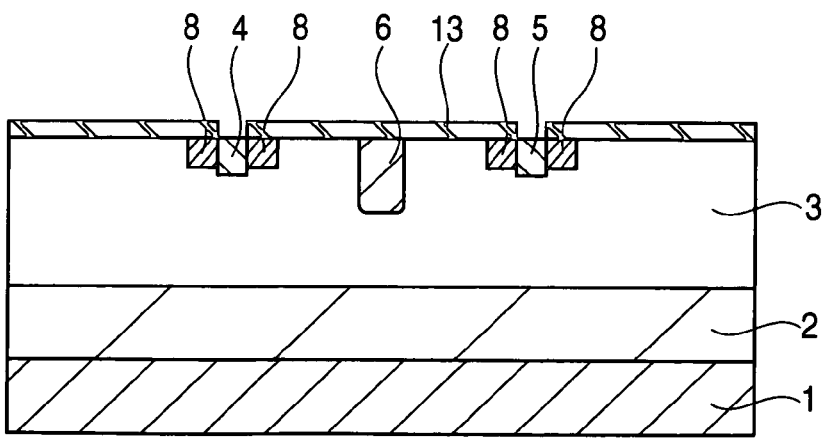
Figure 4:
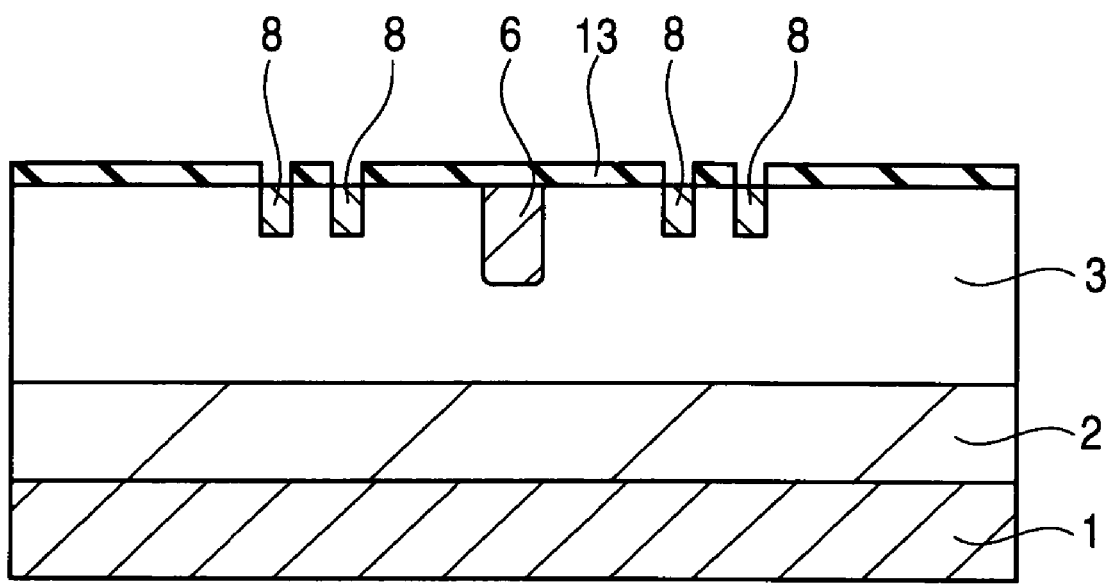
FIG. 4 shows a cross-sectional view of another process of producing J-FET of the first embodiment of the invention.
Figure 5:
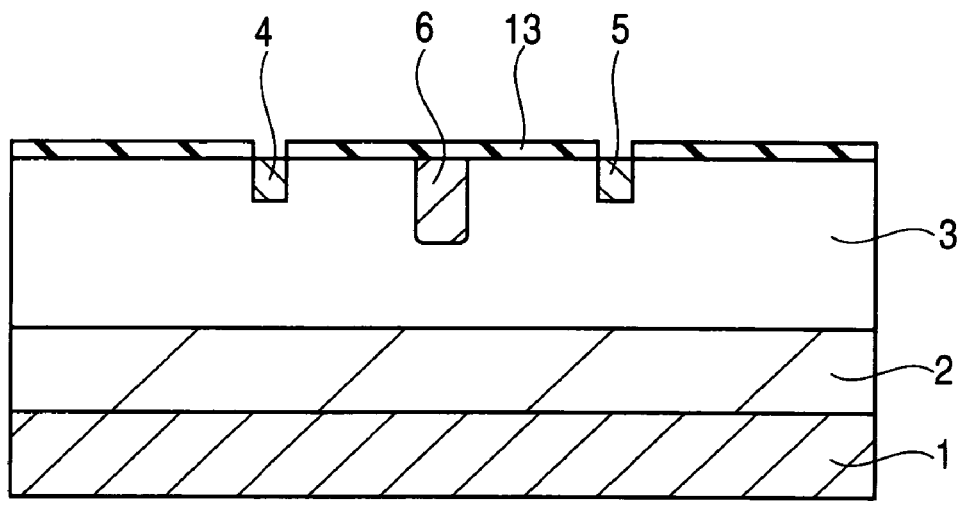
FIG. 5 shows cross-sectional views of still another process of producing J-FET of the first embodiment of the invention.
Figure 5:
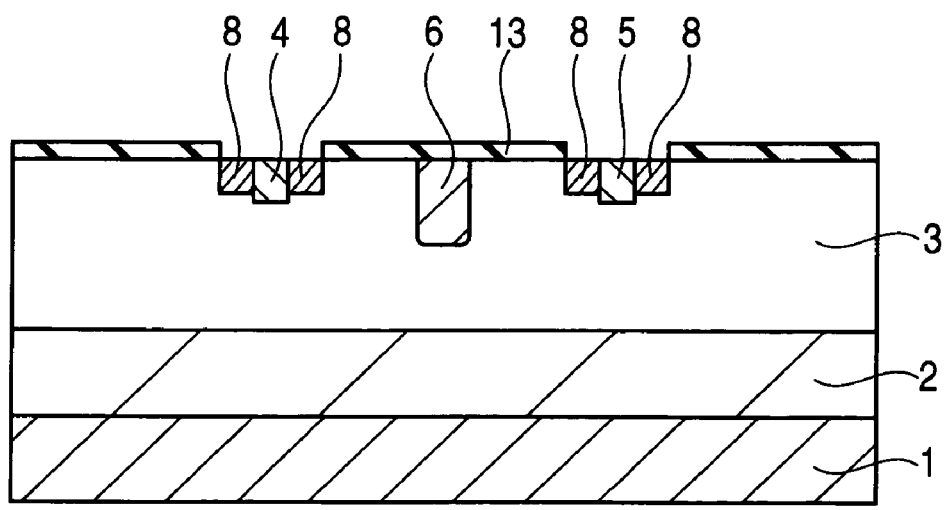

Next described are methods for producing the J-FET structure of the invention with reference to FIGS. 3 to 5 showing schematic cross-sectional views of the devices being produced. FIG. 3 shows a first method for producing the device. As in FIG. 3(*a*), a P-type epitaxial layer 2 and then an N-type epitaxial layer 3 are formed through known CVD on a P$^{++}$-conductive substrate 1. In the CVD step, the deposition temperature is at about 1100° C. The P-type epitaxial layer 2 is a layer for relaxing the boron auto-doping from the P$^{++}$-conductive substrate 1 to the N-type epitaxial layer 3.

Next, a gate diffusion layer 6 and an oxide mask 13 are formed through boron-containing ion implantation and thermal oxidation, as in FIG. 3(*a*). Then, the oxide mask 13 is holed in predetermined regions, and a coating film or the like that may be a boron diffusion source is formed and subjected to thermal oxidation to give a diffusion layer 14 to be a short-circuit preventing layer having an impurity concentration of from $10^{16}$ cm$^{-3}$ to $10^{18}$ cm$^{-3}$, as in FIG. 3(*b*). Next, a predetermined region of the diffusion layer 14 is holed, and a coating layer or the like that may be a phosphorus diffusion source is formed and subjected to thermal oxidation to give a source diffusion layer 4 and a drain diffusion layer 5 that are deeper than the diffusion layer 14, and at the same time, a short-circuit preventing layer 8 is formed, as in FIG. 3(*c*). The process gives a J-FET structure, and this characterizes the invention. Ion implantation may be employed in the step of boron or phosphorus impurity introduction in this process.

A second method for producing the J-FET structure of the invention is described with reference to FIG. 3 and FIG. 4. After the step of FIG. 3(a), the oxide mask 13 is holed in predetermined regions, and a coating film or the like that may be a boron diffusion source is formed and subjected to thermal oxidation to previously give a short-circuit preventing layer 8 having an impurity concentration of from $10^{16}$ cm$^{-3}$ to $10^{18}$ cm$^{-3}$, as in FIG. 4. Next, this is processed according to the step of FIG. 3(c) to thereby form a source diffusion layer 4 and a drain diffusion layer 5 both deeper than the short-circuit preventing layer 8.

A third method for producing the J-FET structure of the invention is described with reference to FIG. 3 and FIG. 5. After the step of FIG. 3(a), the oxide mask 13 is holed in predetermined regions, and a coating film or the like that may be a phosphorus diffusion source is formed and subjected to thermal oxidation to give a source diffusion layer 4 and a drain diffusion layer 5, as in FIG. 5(a). Next, a predetermined region around the source diffusion layer 4 and the drain diffusion layer 5 is holed, and boron containing ions are implanted into it and then heated to give a short-circuit preventing layer 8 that is shallower than the source diffusion layer 4 and the drain diffusion layer 5, as in FIG. 5(b). Ion implantation may be employed in the step of phosphorus impurity introduction in this process.

According to the methods mentioned above, a desired short-circuit preventing layer 8 may be formed with accuracy, in contact with the side walls of the source diffusion layer 4 and the drain diffusion layer 5. In the above-mentioned methods, the short-circuit preventing layer 8 is formed in contact to both side walls of the source diffusion layer 4 and the drain diffusion layer 5. The short-circuit preventing layer 8 may be formed on one side of the source diffusion layer 4 or the drain diffusion layer 5 in the same methods as above in which, however, the position of the hole to be formed in the oxide mask 13 is suitably modified.

Figure 6:
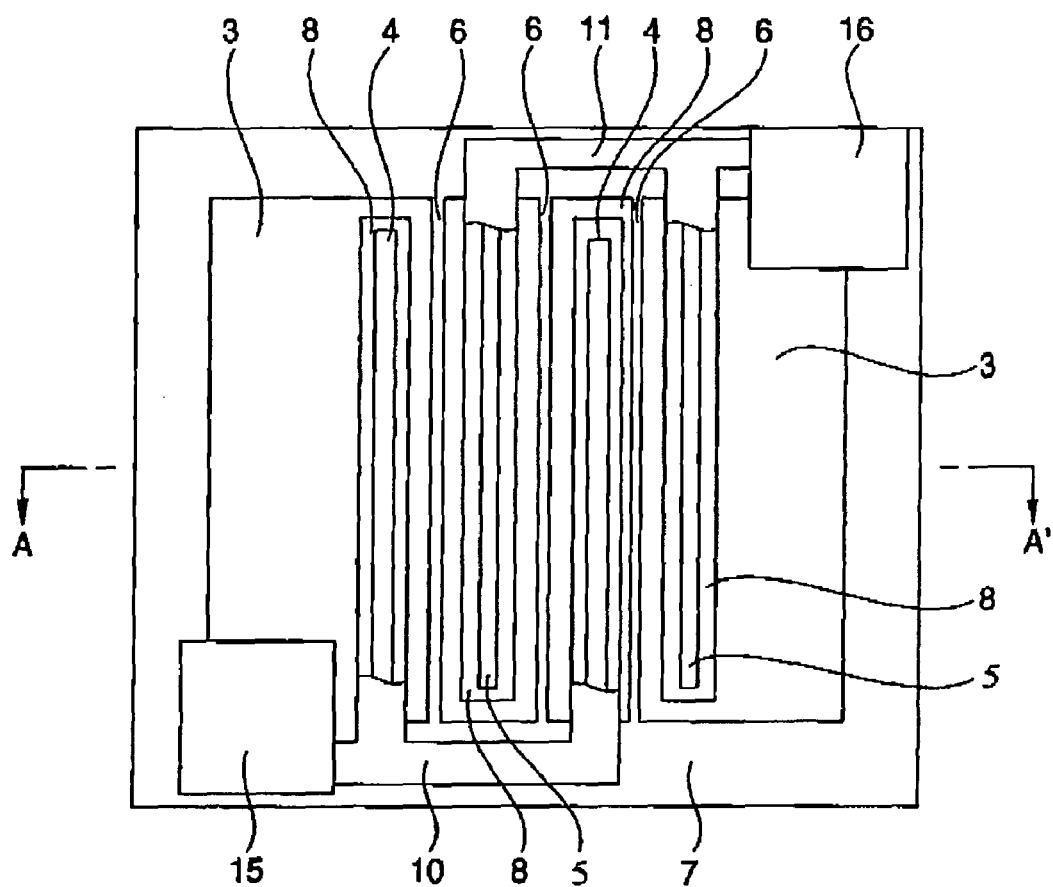
FIG. 6 is a schematic plan view for explaining one application example of the unit J-FET of the first embodiment of the invention to commercial products.
Figure 7:
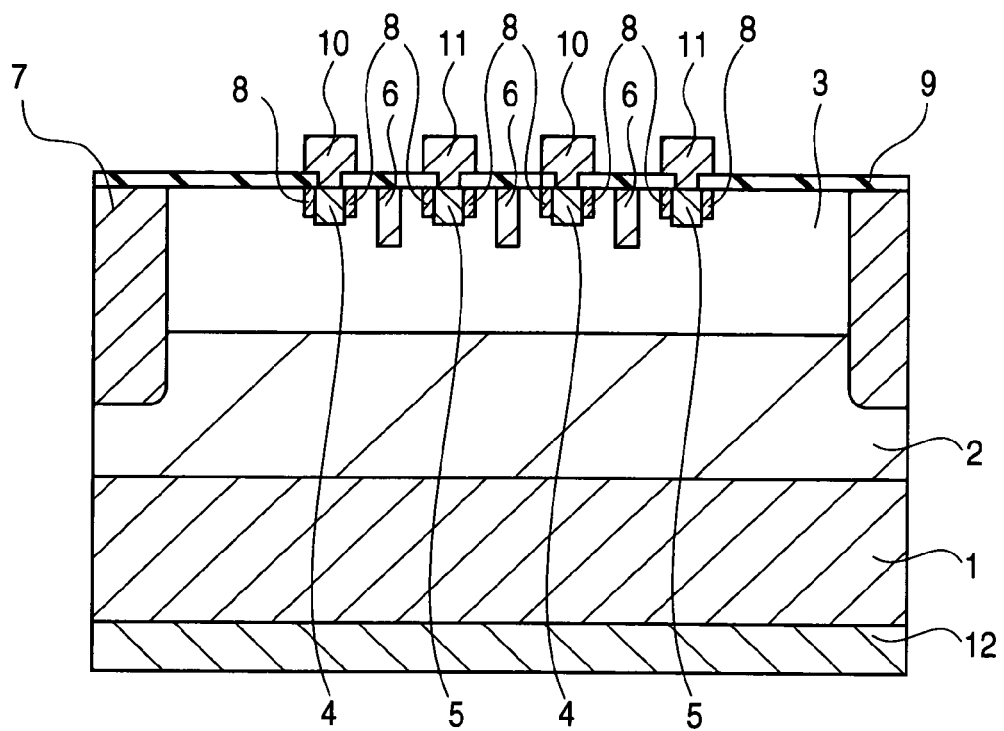
FIG. 7 is a cross-sectional view of the plan view of FIG. 6, cut along the line A-A'.

Now, one mode of applying the J-FET basic structure of the first embodiment mentioned above to semiconductor devices is described with reference to FIG. 6 and FIG. 7. FIG. 6 is a plan view of a unit J-FET; and FIG. 7 is a cross-sectional view of the plan view cut along the line A-A'. In these drawings, the same parts as those in FIG. 1 are designated by the same reference numerals as therein. The significant difference between the unit J-FET and the J-FET basic structure is that the source diffusion layer 4, the gate diffusion layer 6 and the drain diffusion layer 5 are alternately aligned like comb teeth in the active region, the N-type epitaxial layer 3 in the unit J-FET.

In FIG. 7, a P-type epitaxial layer 2 and an N-type epitaxial layer 3 are formed on a P$^{++}$-conductive substrate 1, like in FIG. 1. In the N-type epitaxial layer 3, formed are N$^{+}$-conductive source diffusion layers 4 and drain diffusion layers 5 each having a depth of about 1 µm and P$^{+}$-conductive gate diffusion layers 6 each having a depth of about 3 µm, alternately aligned as in FIG. 6 and FIG. 7. In this, short-circuit preventing layers 8 of a reverse conduction type are formed in contact with both side walls of the respective source diffusion layers 4 and drain diffusion layers 5. In this, the depth of the short-circuit preventing layer 8 is 0.8 µm or so and is shorter than that of the source diffusion layers 4 and the drain diffusion layers 5.

Connected to the gate diffusion layer 6, a P$^{+}$-conductive contact diffusion layer 7 is formed. A source electrode 10 and a drain electrode 11 are formed so that they are connected to the source diffusion layer 4 and the drain diffusion layer 5, respectively, via the holes formed in the protective insulation film 9. As in FIG. 6, the source electrode 10 is connected to a source electrode pad 15. Similarly, the drain electrode 11 is connected to a drain electrode pad 16. Aluminium or the like may be used for the electrode material. In FIG. 6, the array of the source diffusion layers 4 and the drain diffusion layers 5 in the active region is shown. In this, therefore, the source electrode 10 and the drain electrode 11 are not shown. As in FIG. 7, the gate electrode 12 is formed of a metal layer to cover the entire back of the P$^{++}$-conductive substrate.

In the device application example illustrated herein above, the spacing distance between the source diffusion layer 4 or the drain diffusion layer 5 and the contact diffusion layer 7 is large, as is understood from FIG. 6. Accordingly, the outermost source diffusion layer 4 or drain diffusion layer 5 of all the source diffusion layers 4 or the drain diffusion layers 5 that are aligned like comb teeth may have a short-circuit preventing layer 8 formed only on one side thereof facing to the gate diffusion layer 6. This is because, when a surge voltage is applied to the device, avalanche breakdown may hardly occur between the layer 4 or 5 and the contact diffusion layer 7 since the spacing distance between them is large as so mentioned above. Avalanche breakdown readily occurs between the gate diffusion layers 6 that are near to each other.

In the unit J-FET device of the invention, the short-circuit preventing layer 8 significantly improves the surge resistance of the device. The increase in the surge resistance of the device brings about another advantage in that the spacing distance between the source diffusion-layer or the drain diffusion layer and the gate diffusion layer may be reduced, and, as a result, the source diffusion layers 4, the gate diffusion layers 6 and the drain diffusion layers 5 can be aligned at high density like comb teeth. Accordingly, improving the operation capabilities of the unit J-FET device is promoted. In addition, since the source diffusion layers 4, the gate diffusion layers 6 and the drain diffusion layers 5 can be aligned at high density like comb teeth, the chip size of the device may be reduced and the input power to be introduced into the gate of the device may be reduced, not lowering the surge resistance of the device.

Second Embodiment of the Invention

Figure 8:
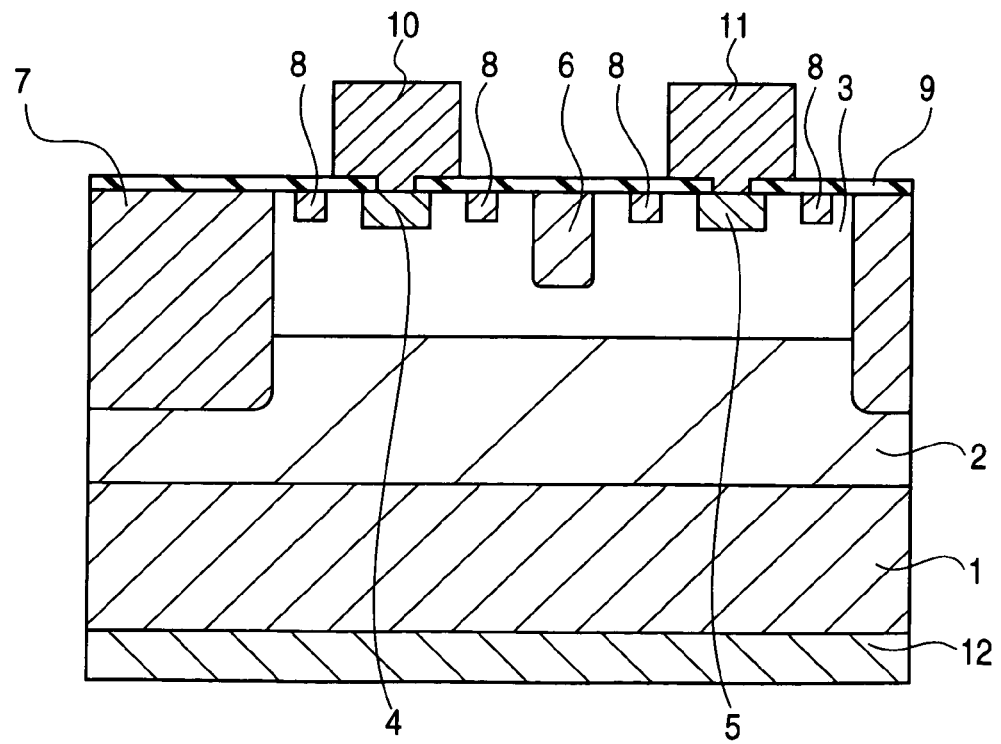
FIG. 8 is a cross-sectional view of a unit J-FET for explaining the second embodiment of the invention.

FIG. 8 is a cross-sectional view showing the basic structure of J-FET of the second embodiment of the invention. Different from the structure of the first embodiment mentioned above, this structure is characterized in that the short-circuit preventing layer 8 is provided between the source diffusion layer 4 or the drain diffusion layer 5 and the gate diffusion layer 6, spaced a little from the source diffusion layer 4 or the drain diffusion layer 5 not in contact with it.

This embodiment is described briefly hereinunder with reference to FIG. 8. The same parts as those described in the first embodiment are designated by the same reference numerals as therein. In FIG. 8, a P-type epitaxial layer 2 and an N-type epitaxial layer 3 are formed on a P$^{++}$-conductive substrate 1. In the N-type epitaxial layer 3, formed are N$^{+}$-conductive source diffusion layer 4 and drain diffusion layer 5, and P$^{+}$-conductive gate diffusion layer 6. As in FIG. 8, a short-circuit preventing layer 8 is provided between the gate diffusion layer 6, and the source diffusion layer 4 and the drain diffusion layer 5, and between the P$^{+}$-conductive contact diffusion layer 7 that is connected to the gate diffusion layer 6, and the source diffusion layer 4 and the drain diffusion layer 5, all spaced from each other. In this, the depth of the short-circuit preventing layer 8 is shorter than that of the source diffusion layer 4 and the drain diffusion layer 5.

The other constitution of this embodiment is the same as that of FIG. 1. Briefly, a source electrode 10 and a drain electrode 11 connected to the source diffusion layer 4 and the drain diffusion layer 5, respectively, are formed via the holes formed in the protective insulation film 9 that covers the entire surface of the device. A gate electrode 12 is formed on the back of the substrate, and this is connected to the gate region via the contact diffusion layer 7. Also in this case, the short-circuit preventing layer 8 is kept floating.

The constitution of the second embodiment brings about the same effect as above for the same reasons as those mentioned in the section of the first embodiment. In this case, however, the short-circuit preventing layer 8 may be formed deeper than that in the first embodiment. This is because, since the short-circuit preventing layer 8 is spaced from the source diffusion layer 4 or the drain diffusion layer 5, it does not so much interfere with the current pass through the J-FET being driven. In addition, the surge resistance of J-FET of this embodiment is higher than that of the first embodiment.

Third Embodiment of the Invention

Figure 9:
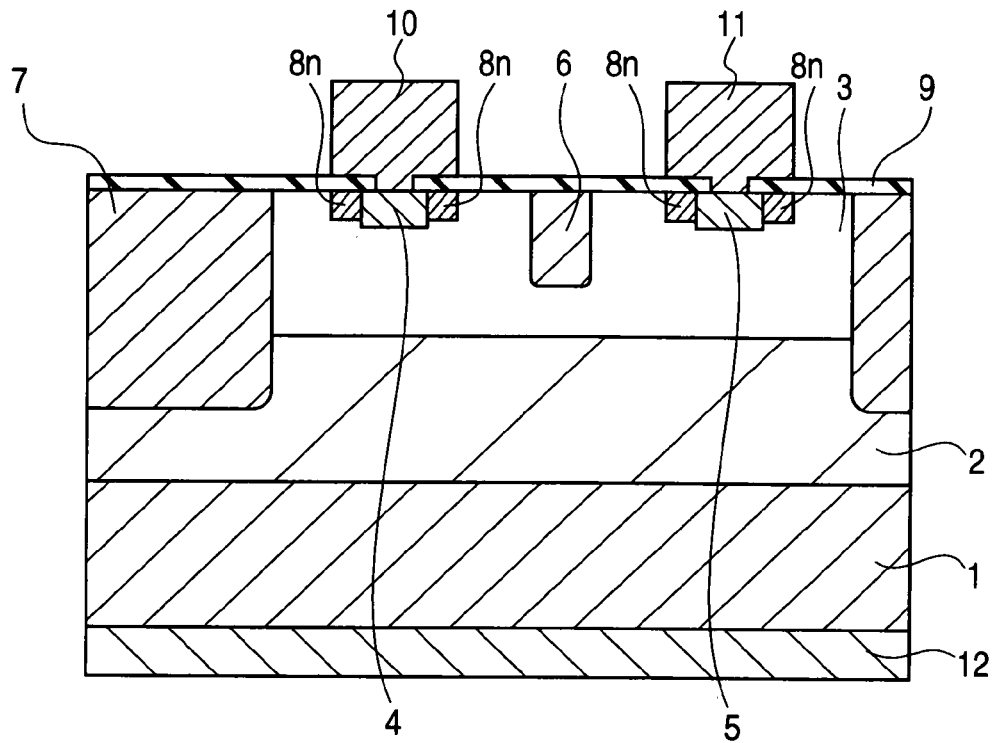
FIG. 9 is a cross-sectional view of a unit J-FET for explaining the third embodiment of the invention.

FIG. 9 is a cross-sectional view showing the basic structure of J-FET of the third embodiment of the invention. Different from the structures of the first and second embodiments mentioned above, this structure is characterized in that a short-circuit preventing layer 8n is formed in contact with the side walls of the source diffusion layer 4 or the drain diffusion layer 5, and it is a diffusion layer of the same conduction type as that of the source diffusion layer 4 and the drain diffusion layer 5.

This embodiment is described briefly hereinunder with reference to FIG. 9. The same parts as those described in the first embodiment are designated by the same reference numerals as therein. In FIG. 9, a P-type epitaxial layer 2 and an N-type epitaxial layer 3 are formed on a $P^{++}$-conductive substrate 1. In the N-type epitaxial layer 3, formed are $N^+$-conductive source diffusion layer 4 and drain diffusion layer 5, and a $P^+$-conductive gate diffusion layer 6. As in FIG. 9, a short-circuit preventing layer 8n is formed in contact with both side walls of the source diffusion layer 4 and with both side walls of the drain diffusion layer 5, and it is formed of an N-conductive diffusion layer. In this, the depth of the short-circuit preventing layer 8n is controlled to be on the same level as that of the source diffusion layer 4 and the drain diffusion layer 5. The impurity concentration in the short-circuit preventing layer 8n is controlled to fall between $10^{16}$ $cm^{-3}$ and $10^{10}$ $cm^{-3}$. In that manner, the impurity concentration in the short-circuit preventing layer 8n is kept higher than that in the N-type epitaxial layer 3. Preferably, the former is higher by 10 to 100 times or so than the latter. However, the impurity concentration in the short-circuit preventing layer 8n is kept lower than that in the source diffusion layer 4 or the drain diffusion layer 5. The device of this embodiment may be produced according to the same process as that illustrated in FIGS. 3 to 5, in which, however, N-type phosphorus or arsenic impurity and not boron is used to form the short-circuit preventing layer 8n.

The other constitution of this embodiment is the same as that of FIG. 1. The description of the reference numerals in the drawing is omitted herein. In this case, however, since the short-circuit preventing layer 8n is of the same conduction type as that of the source diffusion layer 4 and the drain diffusion layer 5, they are electrically connected to each other.

The constitution of the third embodiment brings about the same effect as that of the first embodiment. The improvement in the surge resistance of this embodiment is as follows: When a heavy positive voltage, surge voltage is applied to the source diffusion layer 4 or the drain diffusion layer 5, the depletion layer 3d that is formed in the N-type epitaxial layer 3 as in FIG. 2 is formed also inside the short-circuit preventing layer 8n, and the depletion layer 3d acts to retard the punch-through that may reach the high-concentration source diffusion layer 4 or drain diffusion layer 5. In this case, the depth of the short-circuit preventing layer 8n may be on the same level as that of the source diffusion layer 4 and the drain diffusion layer 5. This is because these layers are all of the same conduction type, and the short-circuit preventing layer 8n does not at all interfere with the current pass through the J-FET being driven as in the first embodiment.

Fourth Embodiment of the Invention

Figure 10:
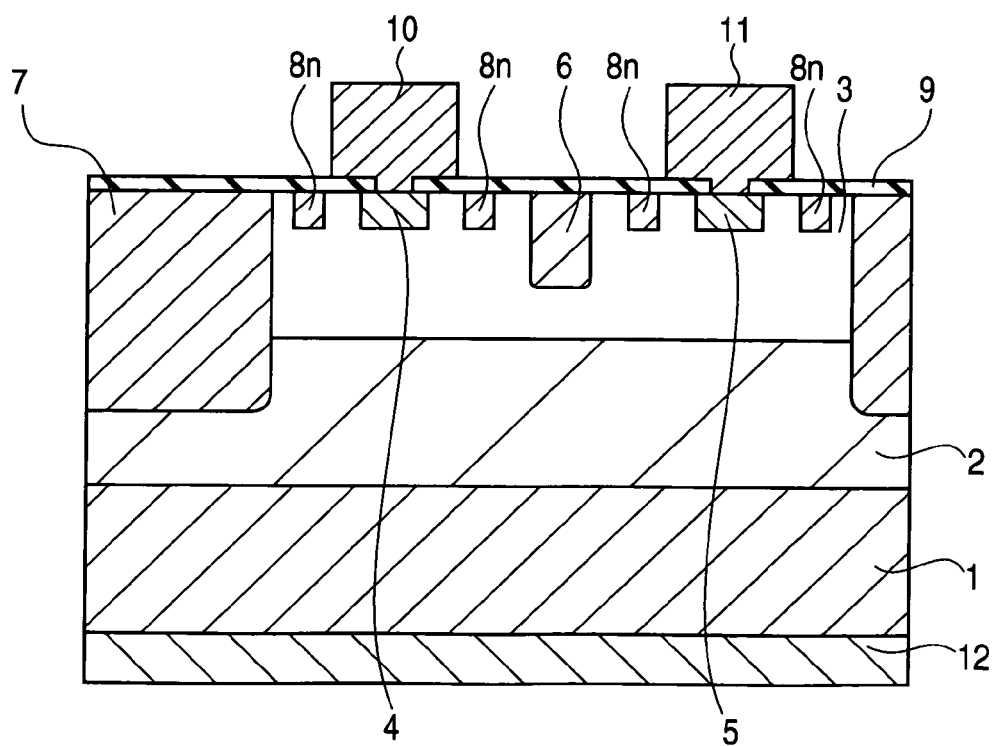
FIG. 10 is a cross-sectional view of a unit J-FET for explaining the fourth embodiment of the invention.

FIG. 10 is a cross-sectional view showing the basic structure of J-FET of the fourth embodiment of the invention. Different from the structure of the third embodiment mentioned above, this structure is characterized in that the short-circuit preventing layer 8n is provided between the source diffusion layer 4 or the drain diffusion layer 5 and the gate diffusion layer 6, spaced a little from the source diffusion layer 4 or the drain diffusion layer 5 not in contact with it.

This embodiment is described briefly hereinunder with reference to FIG. 10. The same parts as those described in the first embodiment are designated by the same reference numerals as therein. In FIG. 10, a P-type epitaxial layer 2 and an N-type epitaxial layer 3 are formed on a $P^{++}$-conductive substrate 1. In the N-type epitaxial layer 3, formed are $N^+$-conductive source diffusion layer 4 and drain diffusion layer 5, and a $P^+$-conductive gate diffusion layer 6. As in FIG. 10, a short-circuit preventing layer 8n is provided between the gate diffusion layer 6, and the source diffusion layer 4 and the drain diffusion layer 5, and between the $P^+$-conductive contact diffusion layer 7 that is connected to the gate diffusion layer 6, and the source diffusion layer 4 and the drain diffusion layer 5, all spaced from each other. In this, the depth of the short-circuit preventing layer 8n is on the same level as that of the source diffusion layer 4 and the drain diffusion layer 5.

The other constitution of this embodiment is also the same as that of FIG. 1, and the description of the reference numerals in the drawing is omitted herein. In this case, since the short-circuit preventing layer 8n is of the same conduction type as that of the source diffusion layer 4 and the drain diffusion layer 5, they are electrically connected to each other. The constitution of the fourth embodiment brings about the same effect as above for the same reasons as those mentioned in the section of the third embodiment In this case, the impurity concentration in the short-circuit preventing layer 8n may be on the same level as that in the source diffusion layer 4 or the drain diffusion layer 5.

In place of the positional relationship between the source diffusion layer 4 of the drain diffusion layer 5 and the short-circuit preventing layer 8 (8n) referred to in the above-mentioned embodiments, the positional relationship between the gate diffusion layer 6 and the short-circuit preventing layer is specifically referred to in the fifth to eighth embodiments of the invention that are described below.

Fifth Embodiment of the Invention

Figure 11:
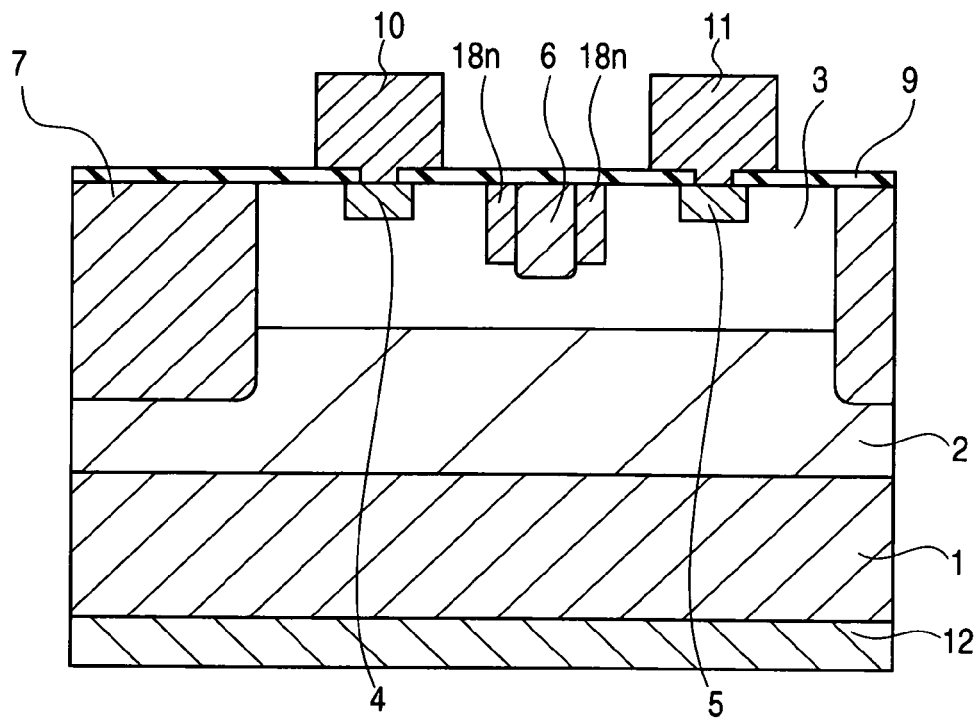
FIG. 11 is a cross-sectional view of a unit J-FET for explaining the fifth embodiment of the invention.

FIG. 11 is a cross-sectional view showing the basic structure of J-FET of the fifth embodiment of the invention. This structure is characterized in that a short-circuit preventing layer 18n of an N-conductive diffusion layer is formed in contact with the side walls of the gate diffusion layer 6. This embodiment is described briefly hereinunder with reference to FIG. 11. The same parts as those described in the first embodiment are designated by the same reference numerals as therein. In FIG. 11, a P-type epitaxial layer 2 and an N-type epitaxial layer 3 are formed on a $P^{++}$-conductive substrate 1. In the N-type epitaxial layer 3, formed are $N^+$-conductive source diffusion layer 4 and drain diffusion layer 5, and a $P^+$-conductive gate diffusion layer 6; and a short-circuit preventing layer 18n of an N-conductive diffusion layer is formed in contact with both side walls of the gate diffusion layer 6. In this, the depth of the short-circuit preventing layer 18n is shorter than that of the gate diffusion layer 6. The impurity concentration in the short-circuit preventing layer 18n is controlled to fall between $10^{16}$ cm$^{-3}$ and $10^{18}$ cm$^{-3}$. Also in this case, the impurity concentration in the short-circuit preventing layer 18n is kept higher than that in the N-type epitaxial layer 3. Preferably, the former is higher by 10 to 100 times or so than the latter. The impurity concentration in the short-circuit preventing layer 18n may be on the same level as that of the source diffusion layer 4, the drain diffusion layer 5 and the gate diffusion layer 6.

The other constitution than the above of this embodiment is the same as that of FIGS. 1 to 4. The description of the reference numerals in the drawing is omitted herein. In this case, however, since the short-circuit preventing layer 18n is of the same conduction type as that of the source diffusion layer 4 and the drain diffusion layer 5, they are electrically connected to each other. The constitution of the fifth embodiment brings about the same effect as above for the same reasons as those mentioned in the section of the third embodiment. Also in this case, the short-circuit preventing layer 18n may be more effective when it is deeper. If too deep, however, the layer 18n may have some influences on the operational characteristics of J-FET. Accordingly, when the depth of the short-circuit preventing layer 18n is made shorter than that of the gate diffusion layer 6, then it solves the problem with the layer 18n to interfere with the current pass through the channel region in the device, and provides good J-FET.

Sixth Embodiment of the Invention

Figure 12:
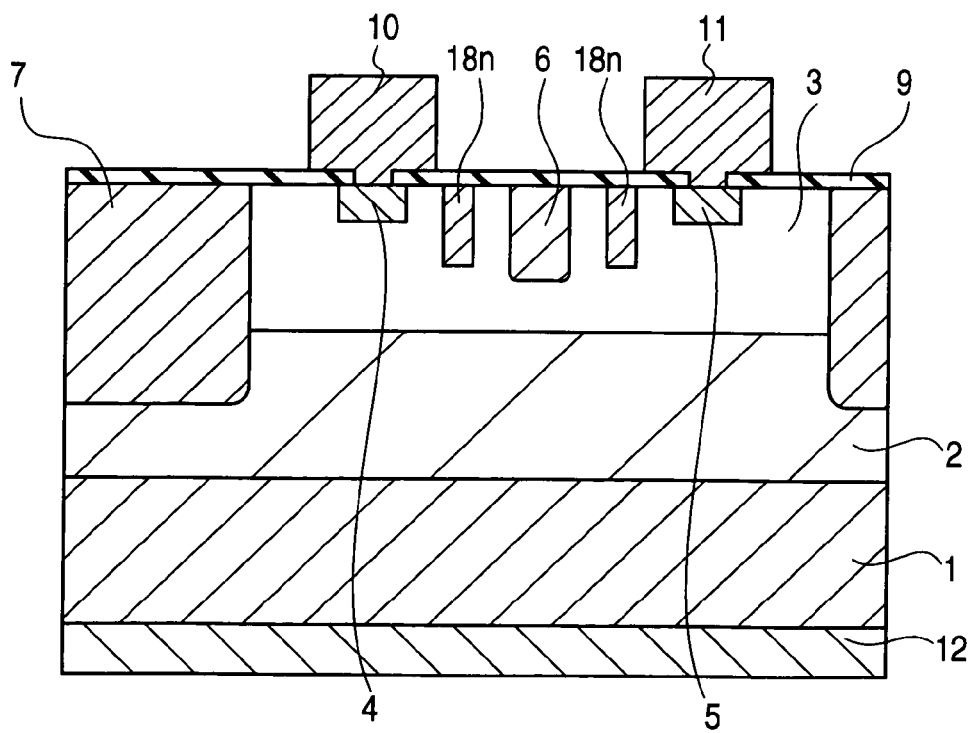
FIG. 12 is a cross-sectional view of a unit J-FET for explaining the sixth embodiment of the invention.

FIG. 12 is a cross-sectional view showing the basic structure of J-FET of the sixth embodiment of the invention. Different from the structure of the fifth embodiment mentioned above, this structure is characterized in that the short-circuit preventing layer 18n is provided between the source diffusion layer 4 or the drain diffusion layer 5 and the gate diffusion layer 6, spaced a little from the layers and not in contact with the side walls of the gate diffusion layer 6. This embodiment is described briefly hereinunder with reference to FIG. 12. The same parts as those described in the first embodiment are designated by the same reference numerals as therein. In FIG. 12, a P-type epitaxial layer 2 and an N-type epitaxial layer 3 are formed on a $P^{++}$-conductive substrate 1. In the N-type epitaxial layer 3, formed are $N^+$-conductive source diffusion layer 4 and drain diffusion layer 5, and a $P^+$-conductive gate diffusion layer 6. As in FIG. 12, a short-circuit preventing layer 18n is provided between the gate diffusion layer 6, and the source diffusion layer 4 and the drain diffusion layer 5, all spaced from each other. In this, the depth of the short-circuit preventing layer 18n is shorter than that of the gate diffusion layer 6 and is longer than that of the source diffusion layer 4 and the drain diffusion layer 5. Also in this case, the impurity concentration in the short-circuit preventing layer 18n is kept higher than that in the N-type epitaxial layer 3. Preferably, the former is higher by 10 to 100 times or so than the latter. The impurity concentration in the short-circuit preventing layer 18n may be on the same level as that of the source diffusion layer 4, the drain diffusion layer 5 and the gate diffusion layer 6.

The array of the source diffusion layer 4, the drain diffusion layer 5, the gate diffusion layer 6 and the short-circuit preventing layer 18n in this case is similar to that of the fourth embodiment described hereinabove with reference to FIG. 10. The constitution of the sixth embodiment also brings about the same effect as above for the same reasons as those mentioned in the section of the fourth and fifth embodiments.

Seventh Embodiment of the Invention

Figure 13:
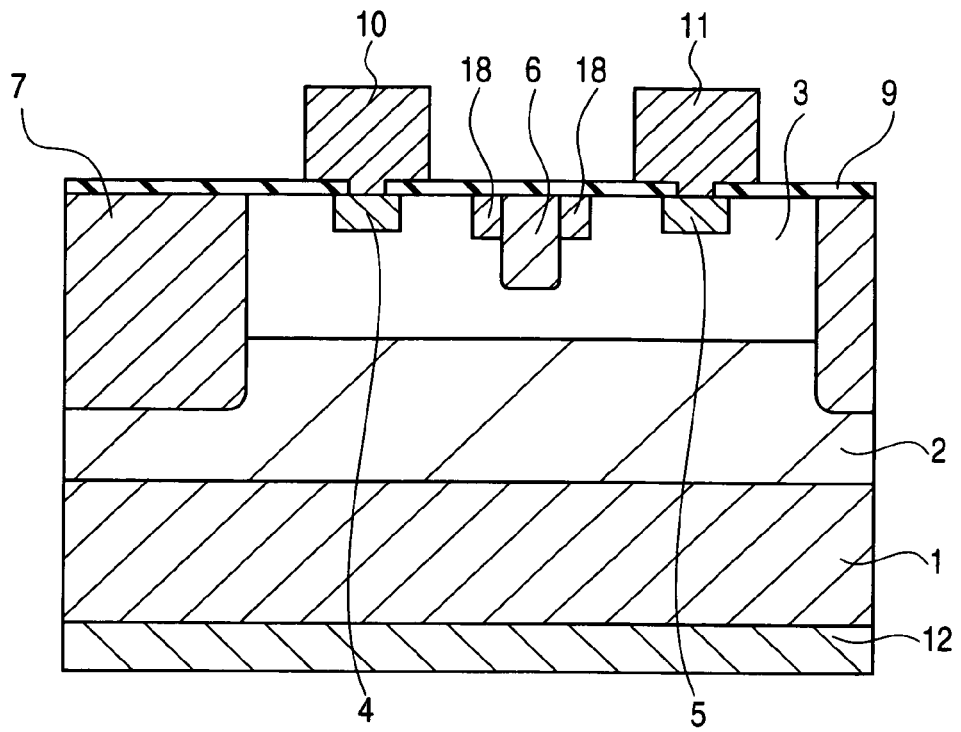
FIG. 13 is a cross-sectional view of a unit J-FET for explaining the seventh embodiment of the invention.

FIG. 13 is a cross-sectional view showing the basic structure of J-FET of the seventh embodiment of the invention. Different from the fifth embodiment mentioned above, this structure is characterized in that a short-circuit preventing layer 18 of a P-conductive diffusion layer is formed in contact with the side walls of the gate diffusion layer 6. This embodiment is described briefly hereinunder with reference to FIG. 13. The same parts as those described in the first embodiment are designated by the same reference numerals as therein. In FIG. 13, a P-type epitaxial layer 2 and an N-type epitaxial layer 3 are formed on a $P^{++}$-conductive substrate 1. In the N-type epitaxial layer 3, formed are $N^+$-conductive source diffusion layer 4 and drain diffusion layer 5, and a $P^+$-conductive gate diffusion layer 6. As in FIG. 13, a short-circuit preventing layer 18 of a P-conductive diffusion layer is formed in contact with both side walls of the gate diffusion layer 6. In this, the depth of the short-circuit preventing layer 18 is shorter than that of the gate diffusion layer 6. The impurity concentration in the short-circuit preventing layer 18 is controlled to fall between $10^{15}$ cm$^{-3}$ and $10^{18}$ cm$^{-3}$, and this is kept lower than that in the gate diffusion layer 6.

The other constitution than the above of this embodiment is the same as that of the embodiments mentioned hereinabove. The description of the reference numerals in the drawing is omitted herein. In this case, since the short-circuit preventing layer 18 is of the same conduction type as that of the gate diffusion layer 6, they are electrically connected to each other. In the constitution of the seventh embodiment, when a heavy negative voltage, surge voltage is applied to the gate diffusion layer 6, or a heavy positive voltage is applied to the source diffusion layer 4, then the depletion layer formed in the short-circuit preventing layer 18 acts to relax the electric field of the surge voltage and therefore retards the avalanche breakdown, thereby improving the surge resistance of J-FET.

Eighth Embodiment of the Invention

Figure 14:
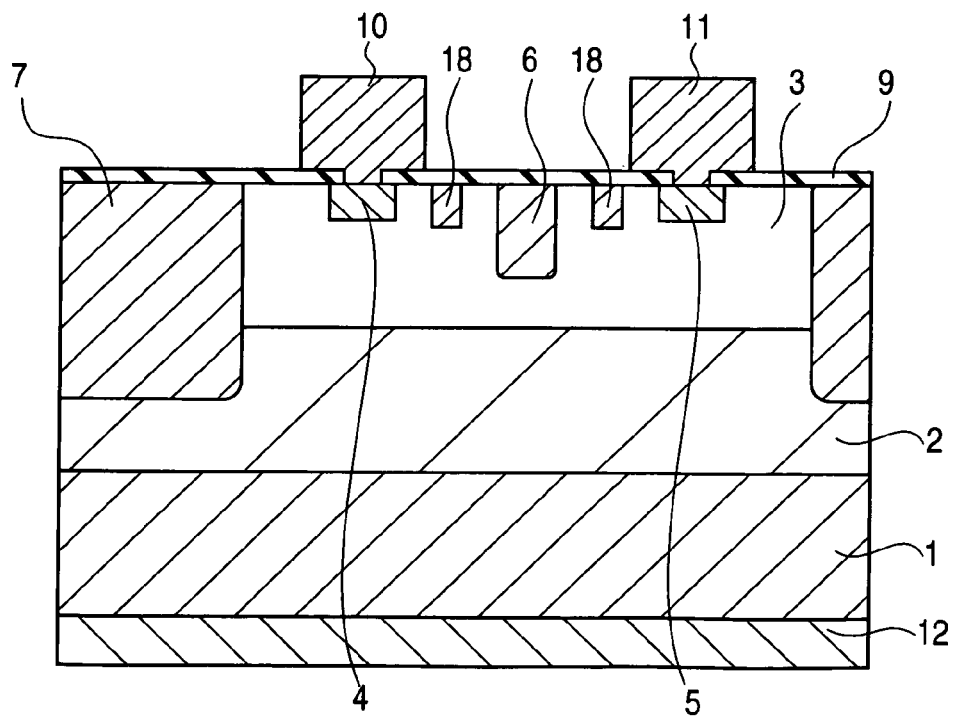
FIG. 14 is a cross-sectional view of a unit J-FET for explaining the eighth embodiment of the invention.

FIG. 14 is a cross-sectional view showing the basic structure of J-FET of the eighth embodiment of the invention. Different from the structure of the seventh embodiment mentioned above, this structure is characterized in that the short-circuit preventing layer 18 is provided between the source diffusion layer 4 or the drain diffusion layer 5 and the gate diffusion layer 6, spaced a little from the layers and not in contact with the side walls of the gate diffusion layer 6. This embodiment is described briefly hereinunder with reference to FIG. 14. The same parts as those described in the first embodiment are designated by the same reference numerals as therein. In FIG. 14, a P-type epitaxial layer 2 and an N-type epitaxial layer 3 are formed on a $P^{++}$-conductive substrate 1. In the N-type epitaxial layer 3, formed are $N^+$-conductive source diffusion layer 4 and drain diffusion layer 5, and a $P^+$-conductive gate diffusion layer 6. As in FIG. 14, a short-circuit preventing layer 18 is provided between the gate diffusion layer 6, and the source diffusion layer 4 and the drain diffusion layer 5, all spaced from each other. In this, the short-circuit preventing layer 18 is kept floating. The impurity concentration in the short-circuit preventing layer 18 is controlled to fall between $10^{15}$ cm$^{-3}$ and $10^{18}$ cm$^{-3}$, and is preferably kept lower than that in the gate diffusion layer 6. However, the impurity concentration in the short-circuit preventing layer 18 may be on the same level as that in the gate diffusion layer 6.

The array of the source diffusion layer 4, the drain diffusion layer 5, the gate diffusion layer 6 and the short-circuit preventing layer 18 in this case is similar to that of the second embodiment described hereinabove with reference to FIG. 8. The constitution of the eighth embodiment also brings about the same effect as above for the same reasons as those mentioned in the section of the first and second embodiments with reference to FIG. 1 and FIG. 8.

In the embodiments described hereinabove, the invention is applied to N-type J-FET where the source diffusion layer 4 and the drain diffusion layer 5 are of an N-conduction type and the gate diffusion layer 6 is of a P-conduction type. However, the invention is not limited to these. The invention may also be applied in the same manner as above to P-type J-FET where the source diffusion layer 4 and the drain diffusion layer 5 are of a P-conduction type and the gate diffusion layer 6, is of an N-conduction type. In the latter case of P-type J-FET, the conduction type of all the constitutive parts of the device must be reversed from the that in the N-type J-FET illustrated hereinabove. However, the correlation of the impurity concentration between the constitutive layers mentioned above may apply to both cases of P-type J-FET and N-type J-FET.

The invention should not be limited to the embodiments mentioned hereinabove. Within the technical scope thereof, the invention may be changed and modified in any desired manner. Like to the unit J-FET structures mentioned hereinabove, the invention may apply also to semiconductor devices of J-FETs integrated alone and to semiconductor devices thereof integrated along with any other elements such as Bip transistors, MISFETS, etc.

As described in detail hereinabove with reference to its preferred embodiments, the invention provides a semiconductor device having a junction field-effect transistor (J-FET) that comprises, formed in the surface of a channel region of a first conduction-type semiconductor region, source/drain diffusion regions of a high-concentration diffusion region of the first conduction type, and a gate diffusion region of a second conduction type that differs from the first conduction type, formed between the source/drain diffusion regions, wherein a short-circuit preventing layer is formed in the surface between the gate diffusion region and the source/drain diffusion regions. Having the constitution, the advantage of the semiconductor device of the invention is that, even when the device has received a surge voltage, the short-circuit preventing layer may act to prevent the depletion layer from extending in the surface region and to retard the punch-through in the device, thereby improving the surge resistance of J-FET.

What is claimed is:

1. A semiconductor device having a junction field-effect transistor, the junction field-effect transistor comprising:
    a source diffusion region and a drain diffusion region, which are formed in a first conduction-type semiconductor region, and each of which is constituted of a high-concentration diffusion region of the first conduction type, bottom portions of the source diffusion region and the drain diffusion region being in contact with the first conduction-type semiconductor region;
    a source electrode and a drain electrode formed on and contacted to the source diffusion region and the drain diffusion region, respectively; and
    a gate diffusion region, which is constituted of a second conduction type that differs from the first conduction type, and which is formed between the source diffusion region and the drain diffusion region, wherein:
    a first short-circuit preventing layer is formed so as to surround the source diffusion region and a second short-circuit preventing layer is formed so as to surround the drain diffusion region,
    a depth of the first and second short-circuit preventing layers is shorter than that of the source diffusion region and the drain diffusion region,
    at least one of the first and second short-circuit preventing layers is formed so as to be brought into contact with the one of the source diffusion region and the drain diffusion region surrounded by the first and second short-circuit preventing layers, respectively, and
    an insulating layer is disposed between the first short-circuit preventing layer and the source electrode so as to contact and cover an entire surface of the first short-circuit preventing layer.

2. The semiconductor device as claimed in claim 1, wherein the first and second short-circuit preventing layers comprise a diffusion layer of the second conduction type.

3. The semiconductor device as claimed in claim 1, wherein the first and second short-circuit preventing layers comprise a diffusion layer of the first conduction type that has a higher concentration than the semiconductor region and has a lower concentration than the source diffusion region and the drain diffusion region.

4. The semiconductor device as claimed in claim 1, wherein the first and second short-circuit preventing layers are formed in the surface of the channel region adjacent to the gate diffusion region.

5. The semiconductor device as claimed in claim 4, wherein the first and second short-circuit preventing layers are formed around the gate diffusion region.

6. The semiconductor device as claimed in claim 4, wherein a depth of the first and second short-circuit preventing layers is shorter than that of the gate diffusion region.

7. The semiconductor device as claimed in claim 4, wherein the first and second short-circuit preventing comprise a diffusion layer of the first conduction type.

8. The semiconductor device as claimed in claim 4, wherein the first and second short-circuit preventing comprise a diffusion layer of the second conduction type that has a lower concentration than the gate diffusion region.

9. The semiconductor device as claimed in claim 1, wherein the semiconductor region is formed on a high-concentration substrate of the second conduction type; and a part of the gate diffusion region is electrically connected thereto via a contact diffusion extended from a substrate surface to the high-concentration substrate.

10. The semiconductor device as claimed in claim 1, wherein the source diffusion region and the drain diffusion region are aligned opposite to each other like comb teeth, the source electrode is formed above the source diffusion region via an opening formed in a protecting film and the drain electrode is formed above the drain diffusion region via an opening formed in the protecting film.

11. The semiconductor device as claimed in claim 1, wherein at least one of the first and second short-circuit preventing layers is constituted of a diffusion layer having the second conduction type.

12. The semiconductor device as claimed in claim 1, the first short-circuit preventing layer is formed so as to fully surround the source diffusion region and the second short-circuit preventing layer is formed so as to fully surround the drain diffusion region.

13. A semiconductor device having a junction field-effect transistor, the junction field-effect transistor comprising:
- a source diffusion region and a drain diffusion region, which are formed in a first conduction-type semiconductor region, and each of which is constituted of a high-concentration diffusion region of the first conduction type, bottom portions of the source diffusion region and the drain diffusion region being in contact with the first conduction-type semiconductor region;
- a source electrode and a drain electrode formed on and connected to the source diffusion region and the drain diffusion region, respectively; and
- a gate diffusion region, which is constituted of a second conduction type that differs from the first conduction type, and which is formed between the source diffusion region and the drain diffusion region, wherein:
- a short-circuit preventing layer is formed between the gate diffusion region and at least one of the source diffusion region and the drain diffusion region,
- the short-circuit preventing layer is formed so as to be brought into contact with the at least one of the source diffusion region and the drain diffusion region while not being brought into contact with the gate diffusion,
- a depth of the short-circuit preventing layer is shorter than that of at least one of the source diffusion region and the drain diffusion region, and
- an insulating layer is disposed over the short-circuit preventing layer so as to contact and cover an entire surface of the short-circuit preventing layer.

14. The semiconductor device as claimed in claim 13, wherein a depth of the short-circuit preventing layer is shorter than that of the source diffusion region and the drain diffusion region.

15. The semiconductor device as claimed in claim 13, wherein the short-circuit preventing layer is constituted of a diffusion layer having the second conduction type.

16. A semiconductor device having a junction field-effect transistor, the junction field-effect transistor comprising:
- a source diffusion region and a drain diffusion region, which are formed in a first conduction-type semiconductor region, and each of which is constituted of a high-concentration diffusion region of the first conduction type, bottom portions of the source diffusion region and the drain diffusion region being in contact with the first conduction-type semiconductor region;
- a source electrode and a drain electrode formed on and connected to the source diffusion region and the drain diffusion region, respectively; and
- a gate diffusion region, which is constituted of a second conduction type that differs from the first conduction type, and which is formed between the source diffusion region and the drain diffusion region, wherein:
- a short-circuit preventing layer is formed in at least one of an area between the gate diffusion region and the source diffusion region and an area between the gate diffusion region and the drain diffusion region,
- the source diffusion region and the drain diffusion region are aligned opposite to each other like comb teeth, the source electrode is formed above the source diffusion region via an opening formed in a protecting film and the drain electrode is formed above the drain diffusion region via an opening formed in the protecting film, and
- a depth of the short-circuit preventing layer is shorter than that of the source diffusion region and the drain diffusion region, and
- an insulating layer is disposed over the short-circuit preventing layer so as to contact and cover an entire surface of the short-circuit preventing layer.

17. The semiconductor device as claimed in claim 16, wherein the short-circuit preventing layer is constituted of a diffusion layer having the second conduction type.

* * * * *